(12) United States Patent
Zhong et al.

(10) Patent No.: US 11,804,584 B2
(45) Date of Patent: Oct. 31, 2023

(54) MICRO LIGHT-EMITTING ELEMENT AND DEVICE, AND USE AND PRODUCTION METHOD THEREOF

(71) Applicant: Xiamen Sanan Optoelectronics Technology Co., LTD., Fujian (CN)

(72) Inventors: Zhibai Zhong, Fujian (CN); Chia-En Lee, Fujian (CN); Jinjian Zheng, Fujian (CN); Zheng Wu, Fujian (CN); Chen-Ke Hsu, Fujian (CN); Junyong Kang, Fujian (CN)

(73) Assignee: XIAMEN SANAN OPTOELECTRONICS TECHNOLOGY CO., LTD., Fujian (CN)

( * ) Notice: Subject to any disclaimer, the term of this patent is extended or adjusted under 35 U.S.C. 154(b) by 0 days.

(21) Appl. No.: 17/027,405

(22) Filed: Sep. 21, 2020

(65) Prior Publication Data
US 2021/0013388 A1 Jan. 14, 2021

Related U.S. Application Data

(63) Continuation-in-part of application No. PCT/CN2019/072023, filed on Jan. 16, 2019.

(30) Foreign Application Priority Data

Mar. 22, 2018 (CN) .......................... 201810241966.2

(51) Int. Cl.
*H01L 33/62* (2010.01)
*H01L 33/00* (2010.01)
(Continued)

(52) U.S. Cl.
CPC .......... *H01L 33/62* (2013.01); *H01L 25/0753* (2013.01); *H01L 33/0093* (2020.05);
(Continued)

(58) Field of Classification Search
None
See application file for complete search history.

(56) References Cited

U.S. PATENT DOCUMENTS

| 2005/0211989 A1* | 9/2005 | Horio | H01L 33/46 |
| | | | 257/E33.068 |
| 2014/0361326 A1* | 12/2014 | Song | H01L 25/167 |
| | | | 257/98 |
| 2019/0170808 A1* | 6/2019 | Hsiang | G01R 31/2635 |

FOREIGN PATENT DOCUMENTS

| CN | 1354526 A | 6/2002 |
| CN | 108417682 A | 8/2018 |

OTHER PUBLICATIONS

Search Report issued to PCT application No. PCT/CN2019/072023 by the CNIPA dated Apr. 22, 2019.

* cited by examiner

*Primary Examiner* — Robert K Carpenter
(74) *Attorney, Agent, or Firm* — Muncy, Geissler, Olds & Lowe, P.C.

(57) ABSTRACT

A micro light-emitting device includes a support substrate, at least one micro light-emitting element, and a support structure. The support structure includes a bonding layer, an electrically conductive layer, and a protective insulation layer. The micro light-emitting element is supported by the support structure on the support substrate. The micro light-emitting element includes a light-emitting structure and first and second electrodes. First and second contact regions of the first electrode are respectively connected to a supporting post portion of the electrically conductive layer and a surrounding post portion of the protective insulation layer. A production method of the device and use of the element are also disclosed.

3 Claims, 7 Drawing Sheets

(51) Int. Cl.
*H01L 33/36* (2010.01)
*H01L 25/075* (2006.01)
(52) U.S. Cl.
CPC ...... *H01L 33/36* (2013.01); *H01L 2933/0016* (2013.01); *H01L 2933/0066* (2013.01)

MICRO LIGHT-EMITTING ELEMENT AND DEVICE, AND USE AND PRODUCTION METHOD THEREOF

CROSS-REFERENCE TO RELATED APPLICATION

This application is a bypass continuation-in-part application of International Application No. PCT/CN2019/072023 filed on Jan. 16, 2019, which claims priority of Chinese Patent Application No. 201810241966.2, filed on Mar. 22, 2018. The entire content of each of the international and Chinese patent applications is incorporated herein by reference.

FIELD

The disclosure relates to light-emitting elements and devices as well as production methods and use thereof, and more particularly to micro light-emitting elements and devices as well as production methods and use thereof.

BACKGROUND

Besides being self-emissive and having a small thickness, a light weight, a wide viewing angle, a short response time, and high light-emitting efficiency like organic light-emitting diodes (OLEDs), micro light-emitting diodes (microLEDs or µLEDs) are also characterized by being able to more easily achieve a high pixel density (e.g. more pixels per inch), a small volume, easy portability, and low power consumption. Accordingly, the development and application of microLEDs have been the focus in the LED industry. Since microLEDs are very small in size (their electrodes are even smaller than probes), complete testing on microLEDs produced becomes a difficult issue. Thus, sampling testing, which normally sacrifices some of microLEDs produced, is currently preferred.

Figure 1:
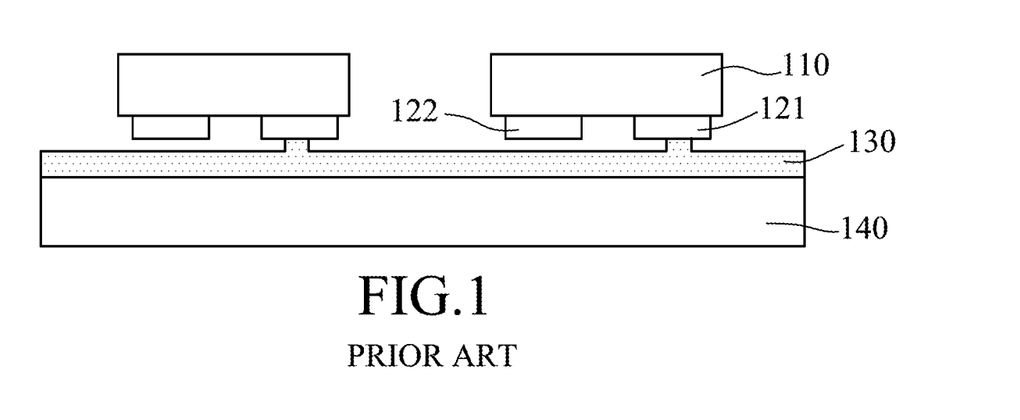
FIG. 1 is a schematic sectional view of a conventional micro light-emitting device.
Figure 2:
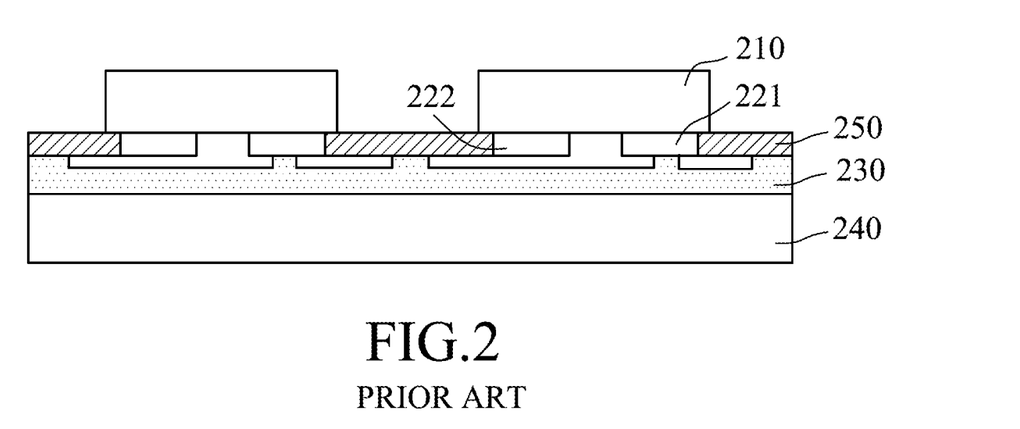
FIG. 2 is a schematic sectional view of another conventional micro light-emitting device.

In addition, in order to accomplish mass transfer, each conventional microLED shown in FIG. 1, which has an epitaxial structure 110 and first and second electrodes 121, 122, is designed to have the first electrode 121 supported by a benzocyclobutene (BCB) insulation layer 130 on a submount 140 for holding the respective microLED up. Alternatively, each conventional microLED shown in FIG. 2, which has an epitaxial structure 210 and first and second electrodes 221, 222, is designed to have the first electrode 221 supported by a BCB insulation layer 230 on a submount 240, and to further have the first and second electrodes 221, 222 connected to a metallic bridge layer 250 which cooperates with the BCB insulation layer 230 to hold the respective microLED up. However, in testing the microLEDs shown in FIGS. 1 and 2, peeling of the first and second electrodes 121, 221, 122, 222 and/or breakage of the metallic bridge layer 250 might occur.

SUMMARY

Therefore, an object of the disclosure is to provide a micro light-emitting element, a micro light-emitting array, and a display device which can alleviate at least one of the drawbacks of the prior art.

The micro light-emitting element is adapted to be supported by a support structure on a support substrate that is capable of conducting electricity. The micro light-emitting element includes an epitaxial light-emitting structure, and a first electrode and a second electrode. The first and second electrodes are both disposed on a side of the light-emitting structure. The first electrode has a first contact region, a second contact region, and a third contact region that are on a surface of the first electrode 321 opposite to the light-emitting structure. The first contact region extends radially from a center of the surface of the first electrode. The second contact region extends radially from the first contact region. The third contact region extends radially from the second contact region. The first, second, and third contact regions are different in at least one of configuration and color.

The micro light-emitting array includes at least two micro light-emitting elements as described above.

The display device includes a micro light-emitting array as described above.

Another object of the disclosure is to provide a micro light-emitting device and a production method thereof which can alleviate at least one of the drawbacks of the prior art.

The micro light-emitting device includes a support substrate, a support structure, and at least one micro light-emitting element. The support substrate is capable of conducting electricity. The support structure includes a bonding layer, an electrically conductive layer, and a protective insulation layer that are sequentially disposed on the support substrate in such order. The electrically conductive layer has a conductive base portion and at least one supporting post portion that extends from the conductive base portion away from the support substrate. The protective insulation layer has an insulation base portion and at least one surrounding post portion that extends from the insulation base portion away from the support substrate and surrounds the supporting post portion. The support structure is interposed between the micro light-emitting element and the support substrate such that the micro light-emitting element is supported by the support structure on the support substrate. The micro light-emitting element includes an epitaxial light-emitting structure and a first electrode and a second electrode. The first and second electrodes are both disposed on a side of the light-emitting structure that faces toward the support structure. The first electrode has a first contact region, a second contact region, and a third contact region that are on a surface of the first electrode opposite to the light-emitting structure. The first contact region extends radially from a center of the surface of the first electrode. The second contact region extends radially from the first contact region. The third contact region extends radially from the second contact region. The first contact region of the first electrode is connected to the supporting post portion of the electrically conductive layer. The second contact region of the first electrode is connected to the surrounding post portion of the protective insulation layer.

The production method includes the following steps. A growth substrate is provided, and at least one epitaxial light-emitting structure is formed thereon. A first electrode and a second electrode are formed on a side of the light-emitting structure that faces away from the growth substrate, so as to form at least one micro light-emitting element on the growth substrate. An insulating layer is formed partially over the micro light-emitting element, so that the first and second electrodes are partially exposed. A metallic sacrificial layer is formed over the insulating layer and the second electrode. A protective insulation layer is formed over the metallic sacrificial layer and the first electrode, and a through hole is formed to partially expose the first electrode so that the protective insulation layer has an insulation base portion and at least one surrounding post portion extending from the insulation base portion toward the growth substrate. An electrically conductive layer is formed over the protective insulation layer, in the through hole, and over the first electrode, so that the electrically conductive layer has a conductive base portion and at least one supporting post portion extending from the conductive base portion toward the growth substrate, and so that the surrounding post portion of the protective insulation layer surrounds the supporting post portion. A support substrate is connected with the electrically conductive layer through a bonding layer. The support substrate is capable of conducting electricity. The growth substrate is removed. The insulating layer is etched to partially expose the metallic sacrificial layer. The metallic sacrificial layer is removed so as to form a support structure for supporting the micro light-emitting element on the support substrate. The first electrode has a first contact region, a second contact region, and a third contact region that are on a surface of the first electrode opposite to the light-emitting structure. The first contact region extends radially from a center of the surface of the first electrode. The second contact region extends radially from the first contact region. The third contact region extends radially from the second contact region. The first contact region is connected to the supporting post portion of the electrically conductive layer. The second contact region is connected to the surrounding post portion of the protective insulation layer.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3A:
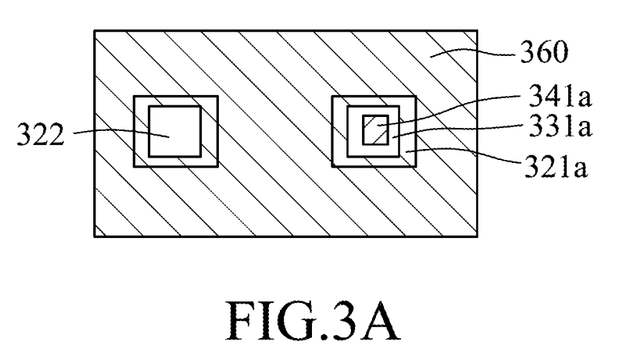
FIG. 3A is a schematic cross-sectional view taken along line 3A-3A in FIG. 3B, illustrating first and second electrodes of an embodiment of a micro light-emitting device according to the present disclosure.
Figure 3B:
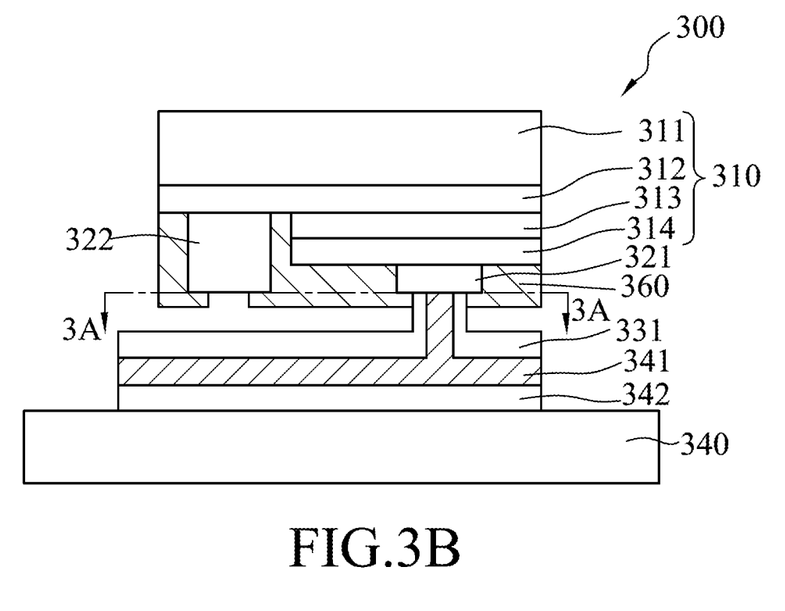
FIG. 3B is a schematic sectional view of the embodiment.

Referring to FIGS. 3A and 3B, an embodiment of a micro light-emitting device according to the present disclosure includes a support substrate 340 capable of conducting electricity, at least one micro light-emitting element 300 (one in this embodiment), and a support structure interposed between the micro light-emitting element 300 and the support substrate 340 for supporting the micro light-emitting element 300 on the support substrate 340.

The micro light-emitting element 300 includes an epitaxial light-emitting structure 310, a first electrode 321, a second electrode 322, and an insulating layer 360.

The light-emitting structure 310 has a first side that faces away from the support structure, and a second side that faces toward the support structure. The light-emitting structure 310 includes a first-type semiconductor layer 314, an active layer 313, a second-type semiconductor layer 312, and a buffer layer 311 that are arranged sequentially from the second side to the first side in such order.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a p-type dopant and the second conductivity type dopant may be an n-type dopant (in this embodiment), and vice versa (in other embodiment).

In this embodiment, the buffer layer 311 is made from undoped GaN (u-GaN), and the active layer 313 has multi-quantum wells.

The first and second electrodes 321, 322 are both disposed on the second side of the light-emitting structure 310, and are respectively connected to the first-type semiconductor layer 314 and the second-type semiconductor layer 312. A total of imaginary projection areas of the first and second electrodes 321, 322 may be not less than 40% of an imaginary projection area of the light-emitting element 300 (even though FIG. 3A is a cross-sectional view, it can be inferred from FIG. 3A the imaginary projection areas of the first and second electrodes 321, 322 and the light-emitting element 300).

As shown in FIG. 3A, the first electrode 321 has a first contact region 341a, a second contact region 331a, and a third contact region 321a that are on a surface of the first electrode 321 opposite to the light-emitting structure 310. The first contact region 341a extends radially from a center of the surface of the first electrode 321. The second contact region 331a extends radially from the first contact region 341a. The third contact region 321a extends radially from the second contact region 331a. The first, second, and third contact regions 341a, 331a, 321a may be different in at least one of configuration (e.g. shape, contour, pattern, etc.) and color.

A periphery of each of the first and second contact regions 341a, 331a of the first electrode 321 may have a shape selected from the group consisting of a polygon, a circle, and a semicircle. The first and second contact regions 341a, 331a may have the same geometric center. An area of the second contact region 331a of the first electrode 321 may be not larger than 5% of an area of the surface of the first electrode 321 which has the first, second, and third contact regions 341a, 331a, 321a.

The first and second electrodes 321, 322 may be coupled to an external power source to serve as test electrodes for testing the light emission ability of the light-emitting structure 310. Specifically, when an electric current supplied by the external power source is passed to the light-emitting structure 310 through the first and second electrodes 321, 322, the active layer 313 of the light-emitting structure 310 emits light. The active layer 313, when made from a nitride-based material, may emit blue light, green light, or ultraviolet light. Alternatively, the active layer 313, when made from aluminum gallium indium phosphide (AlGaInP)-based material, may emit red light, orange light, yellow light, or amber light.

The insulating layer 360 is disposed partially over the light-emitting structure 310 and the first and second electrodes 321, 322. Specifically, the insulating layer 360 is disposed on the second side of the light-emitting structure 310. The third contact region 321a of the first electrode 321 is connected to the insulating layer 360.

The micro light-emitting element 300 may have a size that is not larger than 100 μm×100 μm (for instance, 100 μm×100 μm, 100 μm×50 μm, 50 μm×50 μm or smaller, 20 μm×10 μm, or 10 μm×10 μm). Furthermore, the micro light-emitting element 300 may have a thickness that is not larger than 20 μm (for example, 15 μm or 10 μm).

The support structure includes a bonding layer 342, an electrically conductive layer 341, and a protective insulation layer 331 that are sequentially disposed on the support substrate 340 in such order.

The electrically conductive layer 341 may be made from a metal material. The electrically conductive layer 341 has a conductive base portion and at least one supporting post portion (one in this embodiment) that extends from the conductive base portion away from the support substrate 340.

The protective insulation layer 331 may be made from a material selected from the group consisting of Si, N, $SiO_2$, benzocyclobutene (BCB), and combinations thereof. The protective insulation layer 331 has an insulation base portion and at least one surrounding post portion (one in this embodiment) that extends from the insulation base portion away from the support substrate 340 and surrounds the supporting post portion of the electrically conductive layer 341.

The first contact region 341a of the first electrode 321 is connected to the supporting post portion of the electrically conductive layer 341, and the second contact region 331a of the first electrode 321 is connected to the surrounding post portion of the protective insulation layer 331. Therefore, the supporting post portion of the electrically conductive layer 341 and the surrounding post portion of the protective insulation layer 331 cooperate to hold up the micro light-emitting element 300, such that the second electrode 322 is spaced apart from the support structure by a gap. The micro light-emitting element 300 supported by the support structure on the support substrate 340 can be transferred after testing.

Referring to FIGS. 4 to 14, an embodiment of a production method according to the present disclosure, which is for producing another embodiment of the micro light-emitting device according to the present disclosure, is illustrated. Such another embodiment of the micro light-emitting device is generally similar to the aforesaid embodiment of the micro light-emitting device, except that a plurality of the micro light-emitting elements 300 are provided instead, and that each of the micro light-emitting elements 300 is supported by a corresponding one of the multiple supporting post portions of the electrically conductive layer 341 and a corresponding one of the multiple surrounding post portions of the protective insulation layer 331.

Figure 4:
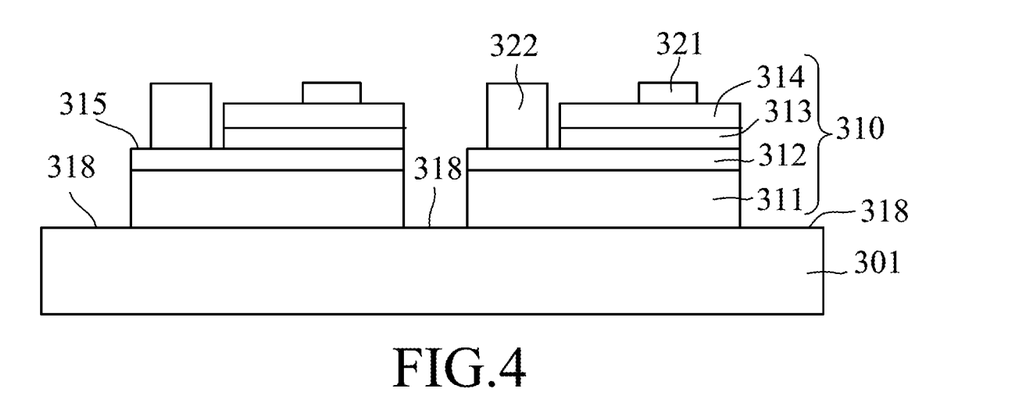
FIGS. 4 to 11 and 13 to 14 are schematic sectional views illustrating an embodiment of a production method according to the present disclosure, which is for producing another embodiment of the micro light-emitting device according to the present disclosure.

As shown in FIG. 4, a growth substrate 301 is provided, and a plurality of the epitaxial light-emitting structures 310 are formed on the growth substrate 301. For each of the light-emitting structures 310, the buffer layer 311, the second-type semiconductor layer 312, the active layer 313, and the first-type semiconductor layer 314 are sequentially formed on the growth substrate 301 in such order.

The growth substrate 301 may be made from a material such as sapphire, aluminum nitride, gallium nitride, silicon, silicon carbide, and gallium arsenide. The surface of the growth substrate 301 for growing the light-emitting structures 310 may be flat or patterned.

The material and layer arrangement of the light-emitting structures 310 may vary when needed, or may be those commonly used in the art.

It should be noted that in order to form the separate light-emitting structures 310 on the growth substrate 301 shown in FIG. 4, an etching process is required to remove a predetermined patterned section of the whole epitaxial growth product (not shown) formed on the growth substrate 301 (removal of such patterned section leads to formation of a patterned separation groove 318). In addition, in order to later form each second electrode 322 on the respective second-type semiconductor layer 312, the etching process is required to remove a portion of the respective active layer 313 and a portion of the respective first-type semiconductor layer 314 (removal of these two portions from the respective light-emitting structure 310 leads to formation of an electrode placement section 315 on the respective second-type semiconductor layer 312). By virtue of the aforesaid etching process, an array of the micro light-emitting elements 300 can be formed.

The term "array" refers to any arrangement of at least two micro light-emitting elements, whether in one or more regularly-spaced or irregularly-spaced strings, or in a geometric or empirically placed "best practical location" arrangement.

Each first electrode 321 is formed on the respective first-type semiconductor layer 314, and each second electrode 322 is formed on the electrode placement section 315 on the respective second-type semiconductor layer 312 (see FIG. 4).

Figure 5:
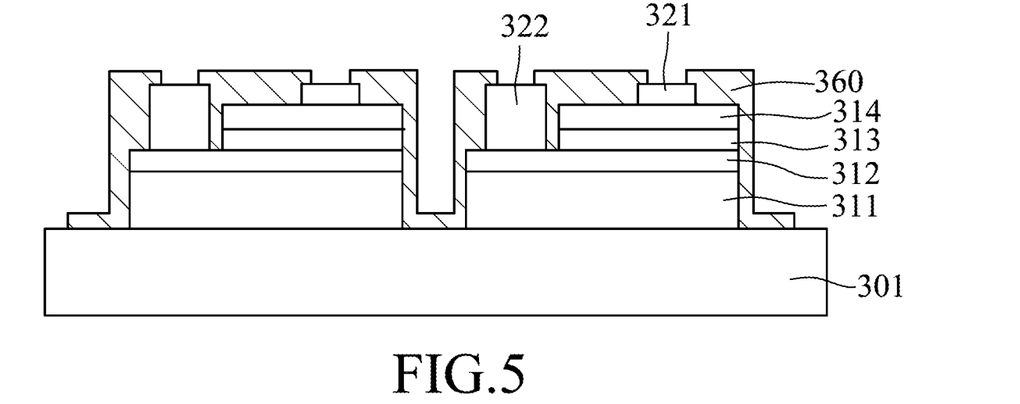

Referring to FIG. 5, the insulating layer 360 is formed partially over the respective micro light-emitting element 300, so that the first and second electrodes 321, 322 on the respective micro light-emitting element 300 are partially exposed. The insulating layer 360 is also formed partially over the separation groove 318. The third contact region 321a of the respective first electrode 321 is connected to the insulating layer 360.

The insulating layer 360 may be made from $SiN_x$ (silicon nitride) or $SiO_2$.

A first extension electrode (not shown) may be formed to extend from the corresponding first electrode 321 to a surface of the insulating layer 360, and a second extension electrode (not shown) may be formed to extend from the corresponding second electrode 322 to the surface of the insulating layer 360. Specifically, the first extension electrode may extend to a portion of the insulating layer 360 over the corresponding first-type semiconductor layer 314, and the second extension electrode may be substantially flush with the first extension electrode for facilitating packaging.

Figure 6:
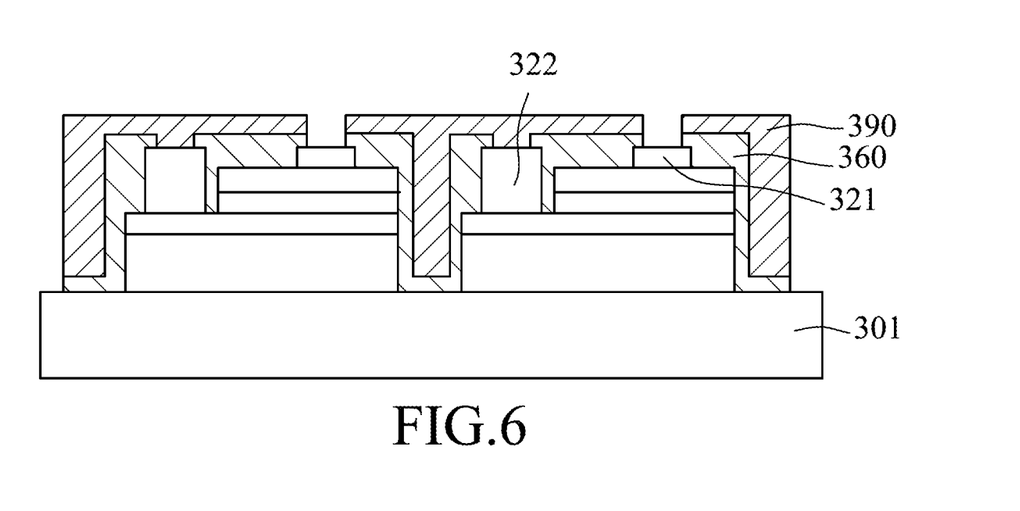

Referring to FIG. 6, a metallic sacrificial layer 390 is formed over the insulating layer 360 and the respective second electrode 322. The metallic sacrificial layer 390 may be not formed over the respective first electrode 321. Alternatively, the metallic sacrificial layer 390 may be also formed over the respective first electrode 321 for facilitating the formation of the metallic sacrificial layer 390. In such case, a portion of the metallic sacrificial layer 390 over the respective first electrode 321 must be removed to expose the respective first electrode 321, and may have an area larger than or equal to that of the hole of the insulating layer 360 exposing the respective first electrode 321.

The metallic sacrificial layer 390 may be made from a material selected from the group consisting of TiW, Al, Cu, Ni, Ti, and combinations thereof. Alternatively, the metallic sacrificial layer 390 may be made from a metallic oxide, a metallic nitride, or other suitable metallic material that can be removed without undesirably removing the layers other than the metallic sacrificial layer 390. The metallic sacrificial layer 390 may have a thickness ranging from 0.1 μm to 5 μm.

To later test the light emission ability, a plurality of separate modules including selected ones of the micro light-emitting elements 300 may be prepared by later removing portions of the metallic sacrificial layer 390 in the separation groove 318 (see FIGS. 12 and 13). In such case, the second electrodes 322 in the respective module are in series connection with the metallic sacrificial layer 390 in the respective module.

Figure 7:
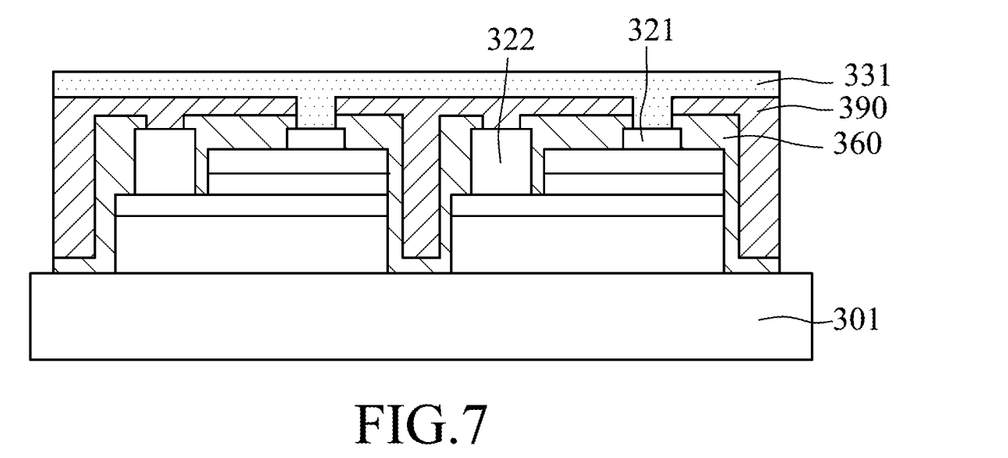

Referring to FIG. 7, the protective insulation layer 331 is formed over the metallic sacrificial layer 390 and the respective first electrode 321. Specifically, the protective insulation layer 331 is formed completely over a surface of the metallic sacrificial layer 390 facing away from the growth substrate 301, and is formed in the holes of the metallic sacrificial layer 390 and the insulating layer 360 that expose the respective first electrode 321.

Figure 8:
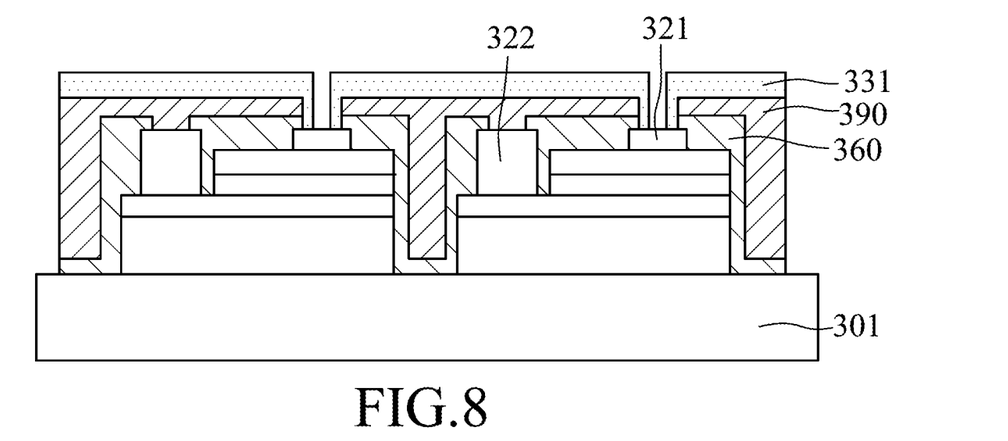

Referring to FIG. 8, by virtue of dry etching, a plurality of through holes are formed to partially expose the first electrodes 321, respectively, so that the protective insulation layer 331 has the insulation base portion and a plurality of the surrounding post portions extending from the insulation base portion toward the growth substrate 301. Each surrounding post portion defines the respective through hole, and isolates the metallic sacrificial layer 390 from the respective through hole. Moreover, each surrounding post portion is connected to the second contact region 331a of the respective first electrode 321.

In accordance with the shape of the periphery of the second contact region 331a of the first electrode 321, a cross-section of the respective through hole may have a shape selected from the group consisting of a polygon (e.g. square or rectangle), a circle, and a semicircle.

Figure 9:
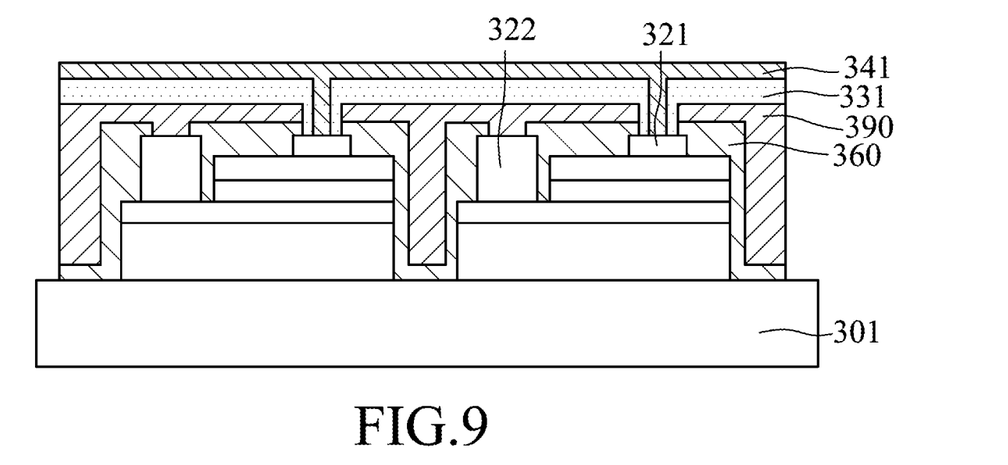

Referring to FIG. 9, the electrically conductive layer 341 is formed over the protective insulation layer 331, in the through holes, and over the first electrodes 321. Specifically, the electrically conductive layer 341 is formed completely over a surface of the protective insulation layer 331 facing away from the growth substrate 301. Therefore, the electrically conductive layer 341 has the conductive base portion and a plurality of the supporting post portions extending from the conductive base portion toward the growth substrate 301. Moreover, the surrounding post portions of the protective insulation layer 331 respectively surround the supporting post portions of the electrically conductive layer 341. Each supporting post portion is connected to the first contact region 341a of the respective first electrode 321.

Figure 10:
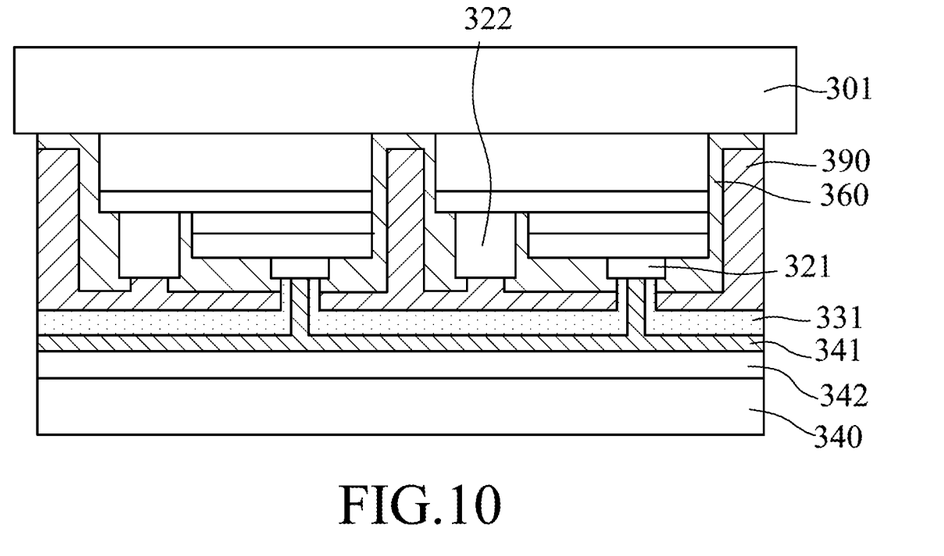

Referring to FIG. 10, the support substrate 340 is connected with the electrically conductive layer 341 through the bonding layer 342. Specifically, a surface of the electrically conductive layer 341 facing toward the support substrate 340 is completely connected to the bonding layer 342.

The bonding layer 342 may be made from a metallic material selected from the group consisting of Al, Sn, Au, Cu, Ni, Ti, and combinations thereof. The support substrate 340 may be made from Si or a metallic material.

Figure 11:
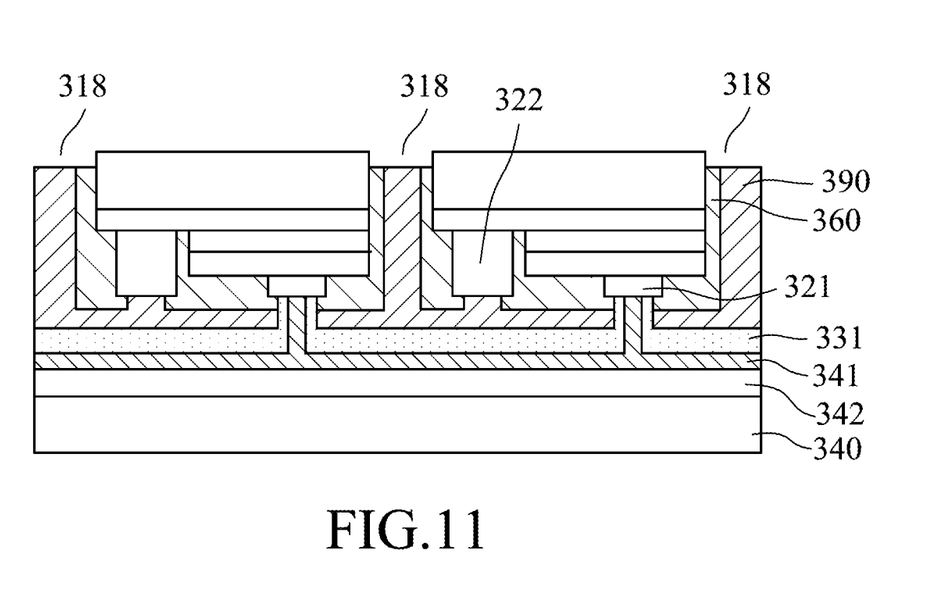

Referring to FIG. 11, the growth substrate 301 is removed. Such removal may be conducted, depending on the material of the growth substrate 301, through various techniques, including laser lift-off, grinding, and etching. In addition, portions of the insulating layer 360 in the separation groove 318 and portions of the light-emitting structures 310 are etched to partially expose the metallic sacrificial layer 390.

Figure 12:
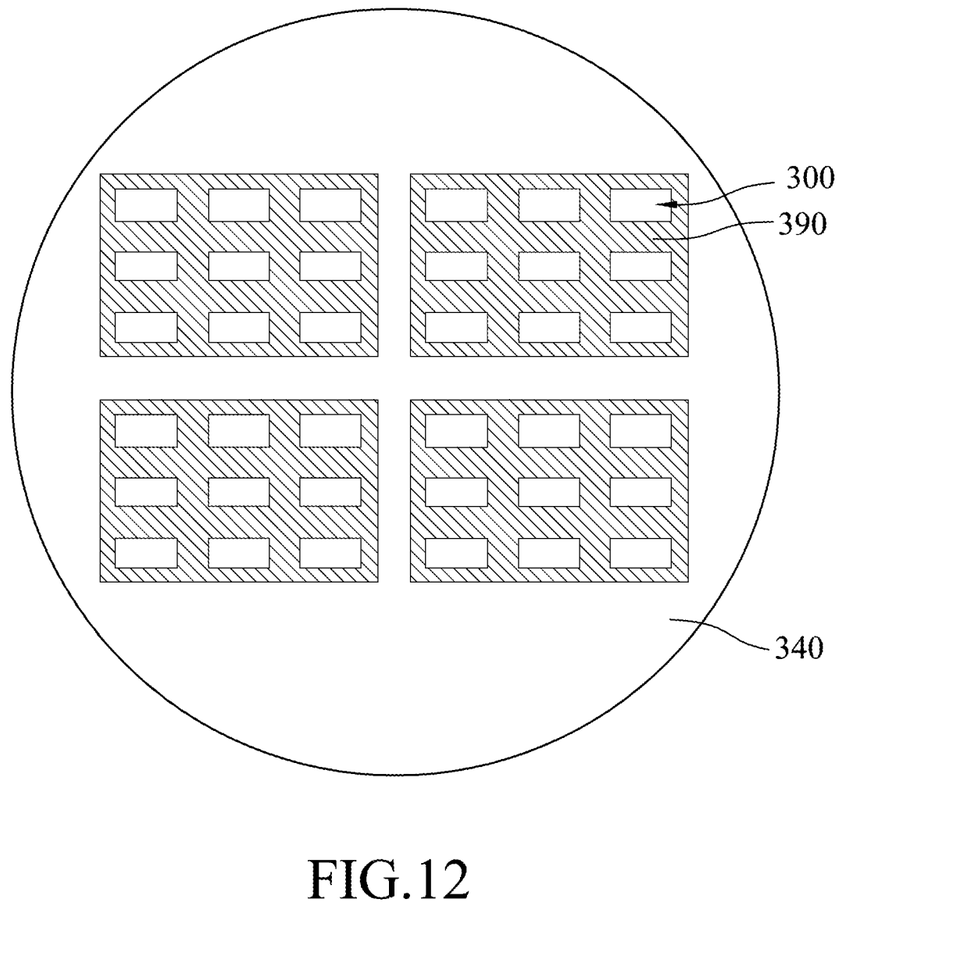
FIG. 12 is a schematic top view illustrating separate modules, each of which includes a plurality of micro light-emitting elements as shown in FIG. 13, and between which portions of a metallic sacrificial layer in a separation groove are removed as shown in FIG. 13.
Figure 13:
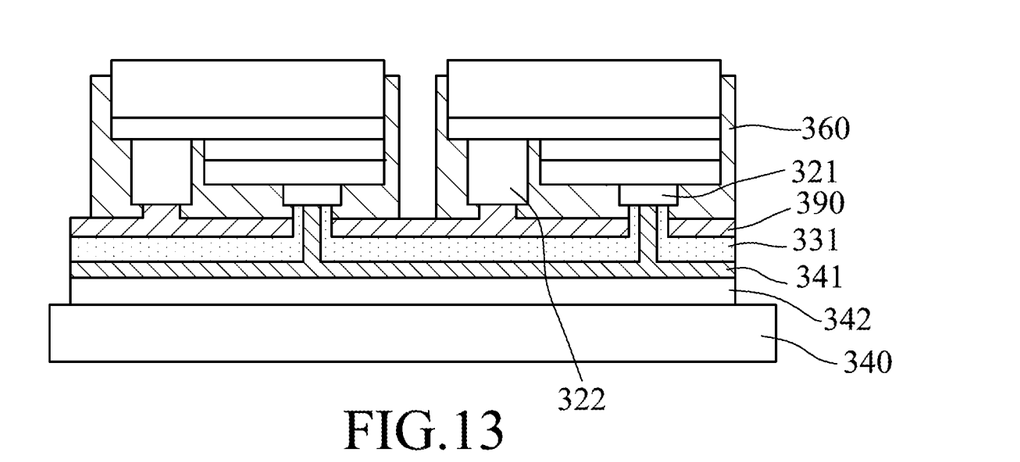

Referring to FIG. 12, the aforesaid separate modules are prepared as described above. Each of these modules may be subjected to complete testing (i.e. testing of all the micro light-emitting elements 300 in the respective module). To be exact, when the aforesaid whole epitaxial growth product formed on the growth substrate 301 has a satisfactory, uniform optoelectronic property, not all of the micro light-emitting elements 300 produced therefrom are required to be tested for their light emission ability. In such case, as shown in FIG. 13, the portions of the metallic sacrificial layer 390 in the separation groove 318 are removed through etching (e.g. wet etching or dry etching) to prepare the aforesaid separate modules, which can be all or selectively subjected to complete testing. To conduct testing, an external power source (not shown) may be coupled with the metallic sacrificial layer 390 and the support substrate 340.

Figure 14:
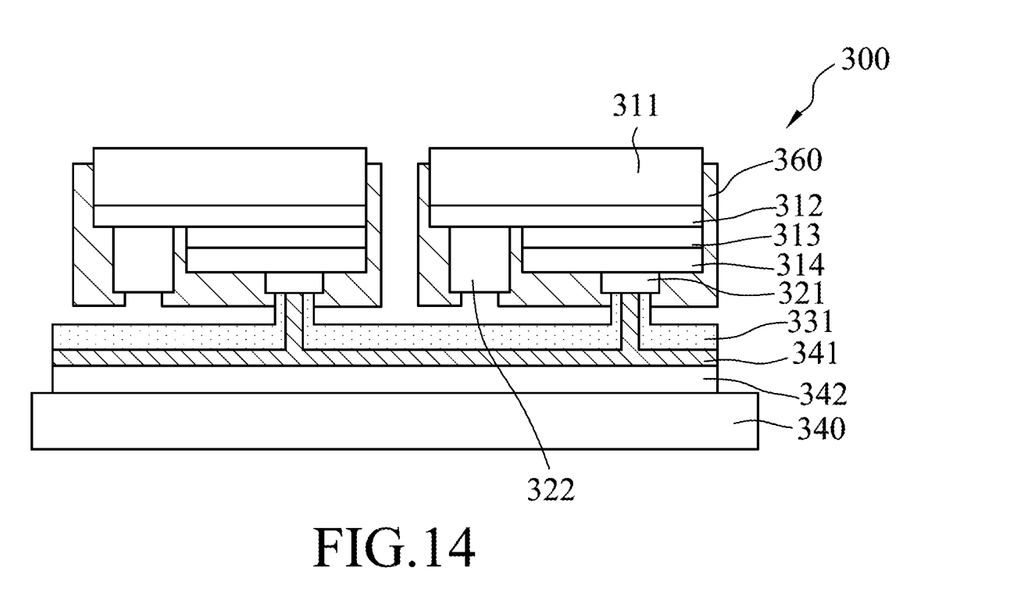

Referring to FIG. 14, the remaining portions of the metallic sacrificial layer 390 are removed so as to form the support structure for supporting the micro light-emitting elements 300 on the support substrate 340. Therefore, the aforesaid another embodiment of the micro light-emitting device is accomplished. The micro light-emitting elements 300 of the micro light-emitting device can be further transferred to produce a micro light-emitting array on a desired substrate, which can be further used to produce a display device.

The advantages of the product and method the present disclosure are described as follows.

Due to the design of the contact regions of the first electrode 321 of the micro light-emitting element(s) 300, and also due to the support structure (specifically, the supporting post portion(s) of the electrically conductive layer 341 and the surrounding post portion (s) of the protective insulation layer 331) for providing both electrical conductivity and structural strength, the micro light-emitting element(s) 300 of the micro light-emitting device can be each tested for the light emission ability without damaging the first and second electrodes 321, 322 and the support structure.

In addition, since the supporting post portion(s) of the electrically conductive layer 341 and the surrounding post portion(s) of the protective insulation layer 331 can cooperate to hold up the micro light-emitting element(s) 300, the micro light-emitting element(s) 300 with the light emission ability already tested can be easily transferred from the support structure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting device, comprising:
a support substrate capable of conducting electricity;
a support structure including a bonding layer, an electrically conductive layer, and a protective insulation layer that are sequentially disposed on said support substrate in such order, said electrically conductive layer having a conductive base portion and at least one supporting post portion extending from said conductive base portion away from said support substrate along a stacking direction such that said conductive base portion is disposed between said at least one supporting post portion and said support substrate and such that said conductive base portion is closer to said support substrate than said at least one supporting post portion, said protective insulation layer having an insulation base portion and at least one surrounding post portion extending from said insulation base portion away from said support substrate and surrounding said supporting post portion; and
at least one micro light-emitting element, said support structure being interposed between said micro light-emitting element and said support substrate such that said micro light-emitting element is supported by said support structure on said support substrate, said micro light-emitting element including an epitaxial light-emitting structure and a first electrode and a second electrode, said first and second electrodes being both disposed on a side of said light-emitting structure that faces toward the support structure, said first electrode having a first contact region, a second contact region, and a third contact region that are on a surface of said first electrode opposite to said light-emitting structure, said first contact region extending radially from a center of said surface of said first electrode, said second contact region extending radially from said first contact region, said third contact region extending radially from said second contact region,
wherein said first contact region of said first electrode is connected to said supporting post portion of said electrically conductive layer, said second contact region of said first electrode being connected to said surrounding post portion of said protective insulation layer, and
wherein said at least one supporting post portion of said electrically conductive layer and said at least one surrounding post portion of said protective insulation layer are directly connected to said micro light-emitting element, and said support substrate and said bonding layer are spaced apart from said micro light-emitting element along the stacking direction.

2. The micro light-emitting device as claimed in claim 1, wherein said micro light-emitting element is held up by said support structure, such that said second electrode is spaced apart from said support structure.

3. The micro light-emitting device as claimed in claim 1, wherein said micro light-emitting element further includes an insulating layer disposed partially over said light-emitting structure and said first and second electrodes, said third contact region of said first electrode being connected to said insulating layer.

* * * * *